United States Patent
Watanabe (10) Patent No.: US 7,923,797 B2
(45) Date of Patent: Apr. 12, 2011

(54) SOLID-STATE IMAGE SENSING DEVICE DRIVING METHOD AND SOLID-STATE IMAGE SENSING APPARATUS

(75) Inventor: Mikio Watanabe, Asaka (JP)

(73) Assignee: Fujifilm Corporation, Tokyo (JP)

( * ) Notice: Subject to any disclaimer, the term of this patent is extended or adjusted under 35 U.S.C. 154(b) by 560 days.

(21) Appl. No.: 12/003,719

(22) Filed: Dec. 31, 2007

(65) Prior Publication Data
US 2008/0129853 A1    Jun. 5, 2008

Related U.S. Application Data

(62) Division of application No. 11/483,519, filed on Jul. 11, 2006, now Pat. No. 7,416,916.

(30) Foreign Application Priority Data

Jul. 13, 2005  (JP) ............................... P2005-204600

(51) Int. Cl.
*H01L 31/0232* (2006.01)
(52) U.S. Cl. ................. 257/432; 257/E51.018; 348/320
(58) Field of Classification Search .................... 257/72, 257/59, 89–90, 92, 215, 258, 13, 432–434, 257/E51.018, E33.001, E31.058; 438/75, 438/144, 57; 348/315, 316, 311, 272, 300, 348/273, 277, 320, 322, 324; 250/208.1, 250/214 R, 214.1
See application file for complete search history.

(56) References Cited

U.S. PATENT DOCUMENTS
7,091,463 B2 * 8/2006 Suzuki et al. ............. 250/208.1

FOREIGN PATENT DOCUMENTS
| JP | 2003-189316 | 7/2003 |
| JP | 2004-304247 A | 10/2004 |
| JP | 2005-020275 | 1/2005 |
| JP | 2007-020118 | 1/2007 |

\* cited by examiner

*Primary Examiner* — Davienne Monbleau
*Assistant Examiner* — Hoa B Trinh
(74) *Attorney, Agent, or Firm* — Birch, Stewart, Kolasch & Birch, LLP (57) ABSTRACT

A method of driving a solid-state image sensing device comprises plural photoelectric conversion devices arranged in rows and columns perpendicular to the rows, VCCDs through which charges generated by the photoelectric conversion devices are transferred in the column direction, and an HCCD through which the charges transferred from the VCCDs are transferred in the row direction. The photoelectric conversion devices include plural photoelectric conversion device rows including the photoelectric conversion devices arranged in the rows include first photoelectric conversion device rows each of which different kinds of photoelectric conversion devices are mixed and second photoelectric conversion device rows each of which has one kind of photoelectric conversion devices. An operation of transferring charges read out of each first photoelectric conversion device row from the VCCDs to the HCCD and an operation of transferring the charges transferred to the HCCD in the row direction are performed with discrimination between the charges of different color components.

6 Claims, 5 Drawing Sheets

SOLID-STATE IMAGE SENSING DEVICE DRIVING METHOD AND SOLID-STATE IMAGE SENSING APPARATUS

This application is a Divisional of application Ser. No. 11/483,519, filed on Jul. 11, 2006, now U.S. Pat. No. 7,416,916 and for which priority is claimed under 35 U.S.C. §120. This application claims priority of Application No. 2005-204600, filed in Japan on Jul. 13, 2005, respectively, under 35 U.S.C. §119; the entire contents of all are hereby incorporated by reference.

BACKGROUND OF THE INVENTION

1. Field of the Invention

The present invention relates to a solid-state image sensing device driving method and a solid-state image sensing apparatus.

2. Description of the Related Art

Image sensing apparatuses equipped with CCD type solid-state image sensing devices, such as a digital still camera and a digital video camera, have come into wide use rapidly. In a CCD type solid-state image sensing device, a large number of photoelectric conversion devices are arranged in rows and columns perpendicular to the rows in one surface of a semiconductor substrate. Vertical charge transfer devices (VCCDs) each made of a CCD (charge coupled device) are arranged one by one, for example, along photoelectric conversion device columns each composed of a plurality of photoelectric conversion devices arranged in the column direction. A horizontal charge transfer device (HCCD) made of a CCD is disposed at respective output ends of the VCCDs.

In a single substrate type CCD type solid-state image sensing device for use in color image sensing, a color filter array is disposed on the large number of photoelectric conversion devices. This color filter array is constituted by color filters disposed one by one on the photoelectric conversion devices respectively. As for the kind of the color filter array, there are an RGB primary color filter array and a complementary color filter array. As for the complementary color filter array, there are known a color filter array composed of only complementary color filters and a color filter array composed of complementary color filters and green filters.

As for a solid-state image sensing device used as an area image sensor, there is known a solid-state image sensing device provided with a large number of photoelectric conversion devices arranged in the form of a tetragonal lattice. As for the color filter array widely used in such a solid-state image sensing device, there is a Bayer's array. The Bayer's array is an array in which rows each including R (red) filters and G (green) filters disposed alternately and repetitively and rows each including G filters and B (blue) filters disposed alternately and repetitively are disposed alternately and repetitively in the column direction. As for the photoelectric conversion device array, there is known a so-called honeycomb array in which odd-numbered rows of photoelectric conversion devices arranged in a row direction and even-numbered rows of photoelectric conversion devices arranged in the row direction are shifted from each other in the row direction by about a half of the arrangement pitch of the photoelectric conversion devices arranged in the row direction. In such a solid-state image sensing device, there is used a so-called G-striped R/B-fully-checkered array of color filters in which the row direction and the column direction in the Bayer's array are inclined at about 45°.

Figure 5:
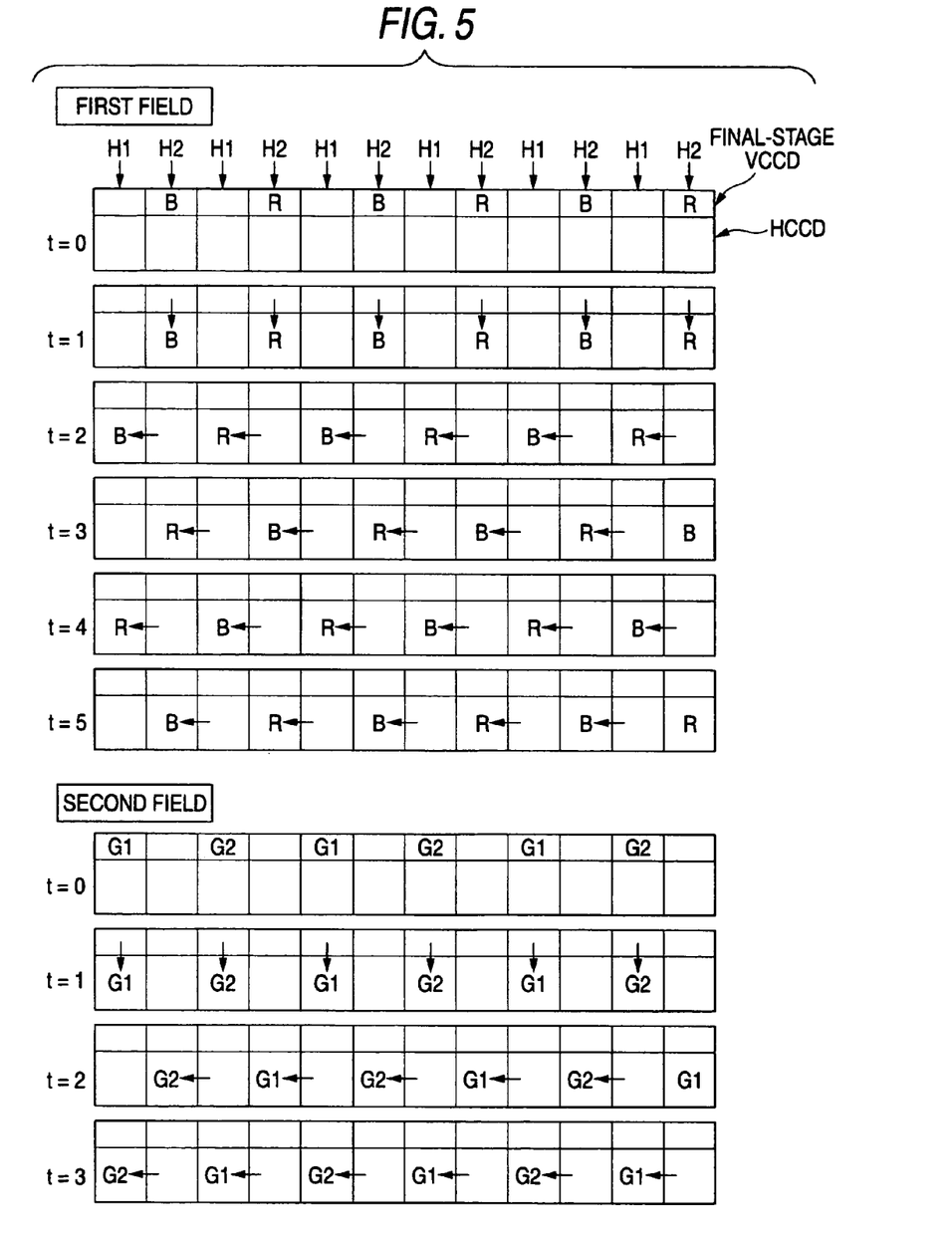
FIG. 5 is a view showing an operating condition of an HCCD when a solid-state image sensing device formed into a honeycomb array is driven by a background-art method.

FIG. 5 is a view showing an operating condition of the HCCD when the solid-state image sensing device of the aforementioned honeycomb array is driven. In the example shown in FIG. 5, there is shown an operating condition when interlace drive for reading out charges is performed twice in such a manner that a first field and a second field are used. In the first field, charges are read out from photoelectric conversion device rows in each of which R photoelectric conversion devices for generating charges of an R component and B photoelectric conversion devices for generating charges of a B component are arranged alternately in a row direction. In the second field, charges are read out from photoelectric conversion device rows in each of which only G photoelectric conversion devices for generating charges of a G component are arranged in the row direction. Moreover, assume that an HCCD is two-phase driven.

First, in the first field, charges (hereinafter referred to as B charges) read out from the B photoelectric conversion devices and charges (hereinafter referred to as R charges) read out from the R photoelectric conversion devices are transferred to final stages of VCCDs and then transferred to the HCCD at time t=1. The charges transferred to the HCCD are transferred to adjacent parts of the HCCD at time t=2. Then, the transfer operation is repeated at times t=2, 3, 4, 5 . . . , so that a signal corresponding to the charges read out from one photoelectric conversion device row is output from an output amplifier. This operation is performed on all the photoelectric conversion device rows in each of which the R photoelectric conversion devices and the B photoelectric conversion devices are arranged alternately in the row direction. Thus, the first field is completed.

Next, in the second field, charges (hereinafter referred to as G charges) read out from the G photoelectric conversion devices are transferred to the final stages of the VCCDs and then transferred to the HCCD at time t=1. The charges transferred to the HCCD are transferred to adjacent parts of the HCCD at time t=2. Then, the transfer operation is repeated at times t=2, 3, . . . , so that a signal corresponding to the charges read out from one photoelectric conversion device row is output from the output amplifier. This operation is performed on all the photoelectric conversion device rows in each of which the G photoelectric conversion devices are arranged in the row direction. Thus, the second field is completed.

In this driving method, in the first field, charges of different color components are transferred to the HCCD in the row direction (horizontally) while mixed. For this reason, if the HCCD is poor in transfer efficiency, there occurs color mixing which is a phenomenon that R charges and B charges are mixed with each other due to transfer failure or the like to thereby result in deterioration of image quality (for example, a red subject forms an image close to magenta).

In order to avoid the color mixing, there has been proposed a method in which HCCDs are provided for the RGB photoelectric conversion devices respectively so that R, G, and B charges are transferred to the HCCDs separately. This method is however under the apprehension that the production cost will increase and lowering of image quality will be caused by variation in gain of an output amplifier connected to each HCCD.

In order to avoid the color mixing without provision of any special configuration, there has been therefore proposed a method for changing the transfer voltage of the HCCD or changing the driving frequency of the HCCD in accordance with image sensitivity (see JP-A-2004-304247).

If the driving frequency of the HCCD is reduced in order to avoid color mixing as in the method disclosed in JP-A-2004-

304247, it becomes difficult to satisfy increase in the number of photoelectric conversion devices.

SUMMARY OF THE INVENTION

The invention is achieved under such circumstances. An object of the invention is to provide a solid-state image sensing device driving method and a solid-state image sensing apparatus in which color mixing can be avoid while the driving frequency of an HCCD can be set at a value enough to satisfy increase in the number of photoelectric conversion devices.

The invention provides a method of driving a solid-state image sensing device, wherein the solid-state image sensing device comprises: a plurality of photoelectric conversion devices arranged in rows and columns perpendicular to the rows, said plurality of photoelectric conversion devices comprising a plurality of kinds of photoelectric conversion devices for generating charges of different color components respectively, so as to comprise a plurality of photoelectric conversion device rows each including those of the photoelectric conversion devices arranged in each of the rows, in which the photoelectric conversion device rows comprises (i) first photoelectric conversion device rows each of which different kinds of photoelectric conversion devices are mixed, and (ii) second photoelectric conversion device rows each of which has one kind of photoelectric conversion devices; first transfer paths through which charges generated by the photoelectric conversion devices are transferred in a column direction; and a second transfer path through which the charges transferred through the first transfer paths are transferred in a row direction, the method comprising: a first step of transferring charges read out of each of the first photoelectric conversion device rows from the corresponding ones of the first transfer paths to the second transfer path and then transferring the charges from the second transfer path in the row direction; and a second step of transferring charges read out of each of the second photoelectric conversion device rows from the corresponding ones of the first transfer paths to the second transfer path and then transferring the charges from the second transfer path in the row direction, wherein, in the first step, a set of: an operation of transferring the charges read out of the first photoelectric conversion device row from the corresponding ones of the first transfer paths to the second transfer path; and an operation of transferring the charges transferred to the second transfer path in the row direction is separately performed with respect to respective sets of charges of the same color component contained in the charges read out of the first photoelectric conversion device rows.

According to this method, charges of different color components do not coexist in the second transfer path. Accordingly, it is possible to prevent color mixing from being caused by transfer failure. As a result, it is possible to make the driving frequency of the second transfer path high enough to satisfy increase in the number of pixels.

In the solid-state image sensing device driving method according to the invention, drive for performing said set of the transfer operations separately with respect to respective sets of charges of the same color component is performed when a still image is sensed and recorded by the solid-state image sensing device.

According to this method, the drive is performed only at the time of sensing a still image, so that power consumption saving can be achieved.

In the solid-state image sensing device driving method according to the invention, reading charges out of photoelectric conversion devices is performed twice in such a manner that reading charges out of the first photoelectric conversion device rows and reading the charges out of the second photoelectric conversion device rows are performed separately.

In the solid-state image sensing device driving method according to the invention, those of the photoelectric conversion devices contained in each of the first photoelectric conversion device rows comprise photoelectric conversion devices for generating charges of a red component and photoelectric conversion devices for generating charges of a blue component; and those of the photoelectric conversion devices contained in each of the second photoelectric conversion device rows comprise photoelectric conversion devices for generating charges of a green component.

In the solid-state image sensing device driving method according to the invention, the first photoelectric conversion device rows and the second photoelectric conversion device rows are arranged alternately in the column direction while shifted from each other in the row direction by about a half of an arrangement pitch of the photoelectric conversion devices arranged in the row direction.

The invention provides a solid-state image sensing apparatus comprising: a solid-state image sensing device comprising: a plurality of photoelectric conversion devices arranged in rows and columns perpendicular to the rows; first transfer paths through which charges generated by the photoelectric conversion devices are transferred in a column direction; and a second transfer path through which the charges transferred through the first transfer paths are transferred in a row direction; and a drive portion that outputs a drive signal for performing drive based on the aforementioned driving method.

DETAILED DESCRIPTION OF THE INVENTION

A preferred embodiment concerned with a solid-state image sensing device driving method and a solid-state image sensing apparatus according to the invention will be described below in detail with reference to the drawings.

First, the configuration of the solid-state image sensing apparatus will be described.

Figure 1:
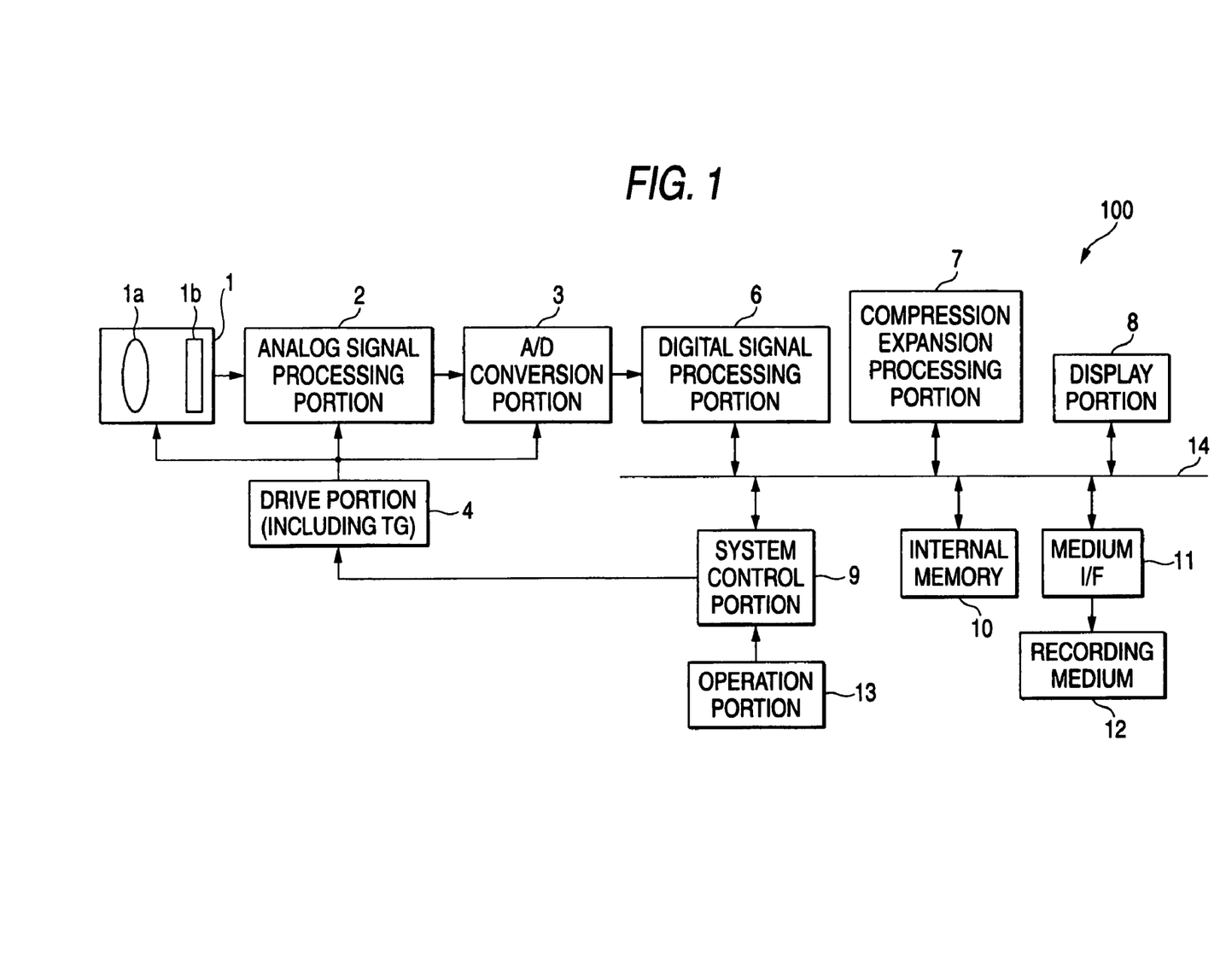
FIG. 1 is a block diagram showing a schematic configuration of a solid-state image sensing apparatus according to the invention.

FIG. 1 is a block diagram showing a schematic configuration of the solid-state image sensing apparatus according to the embodiment.

As shown in FIG. 1, the solid-state image sensing apparatus 100 according to the embodiment includes an image sensing portion 1, an analog signal processing portion 2, an analog-to-digital (A/D) conversion portion 3, a drive portion 4, a digital signal processing portion 6, a compression/expansion processing portion 7, a display portion 8, a system control portion 9, an internal memory 10, a medium interface 11, a recording medium 12, and an operation portion 13. The digital signal processing portion 6, the compression/expansion processing portion 7, the display portion 8, the system control portion 9, the internal memory 10 and the medium interface 11 are connected to a system bus 14.

The image sensing portion 1 has an image sensing lens 1a-containing optical system, and a CCD type solid-state image sensing device 1b, by which an image of a subject is sensed. The image sensing portion 1 outputs a sensed analog image signal. The analog signal processing portion 2 applies predetermined analog signal processing to the sensed image signal obtained by the image sensing portion 1. The A/D conversion portion 3 converts the analog signal processed by the analog signal processing portion 2 into a digital signal.

When the solid-state image sensing apparatus 100 is set in an image sensing mode (a mode capable of sensing an image of a subject and recording data of the sensed image), the drive portion 4 drives the solid-state image sensing device 1b, the analog signal processing portion 2 and the A/D conversion portion 3 on the basis of driving pulses provided from the system control portion 9.

The digital signal processing portion 6 performs digital signal processing on the digital signal from the A/D conversion portion 3 in accordance with an operation mode set by the operation portion 13 to thereby generate sensed image data. Processes executed by the digital signal processing portion 6 include a black level correction process (OB process), a linear matrix correction process, a white balance adjustment process, a gamma correction process, a synchronization process, and a Y/C conversion process. For example, the digital signal processing portion 6 is constituted by a digital signal processor (DSP).

The compression/expansion processing portion 7 applies a compression process to the sensed image data generated by the digital signal processing portion 6 and also applies an expansion process to compressed image data acquired from the recording medium 12.

For example, the display portion 8 is formed to include an LCD display device. The display portion 8 displays an image based on the sensed image data subjected to the digital signal processing. The display portion 8 also displays an image based on image data obtained by a process of expanding compressed image data recorded in the recording medium 12. In addition, the display portion 8 can display a through image at the time of the image sensing mode, various conditions of the digital camera and information concerned with the operation of the digital camera.

The system control portion 9 is chiefly constituted by a processor operated by a predetermined program. The system control portion 9 generally controls the whole of the digital camera 100 inclusive of an image sensing operation.

For example, the internal memory 10 is a DRAM. The internal memory 10 is used as a work memory for the digital signal processing portion 6 and the system control portion 9. The internal memory 10 is also used as a buffer memory for temporarily storing sensed image data recorded in the recording medium 12 and as a buffer memory for image data to be displayed on the display portion 8. The medium interface 11 inputs/outputs data to/from the recording medium 12 such as a memory card.

The operation portion 13 performs various operations at the time of use of the digital camera. The operation portion 13 includes a release button (not shown) for sending an instruction to sense an image.

Figure 2:
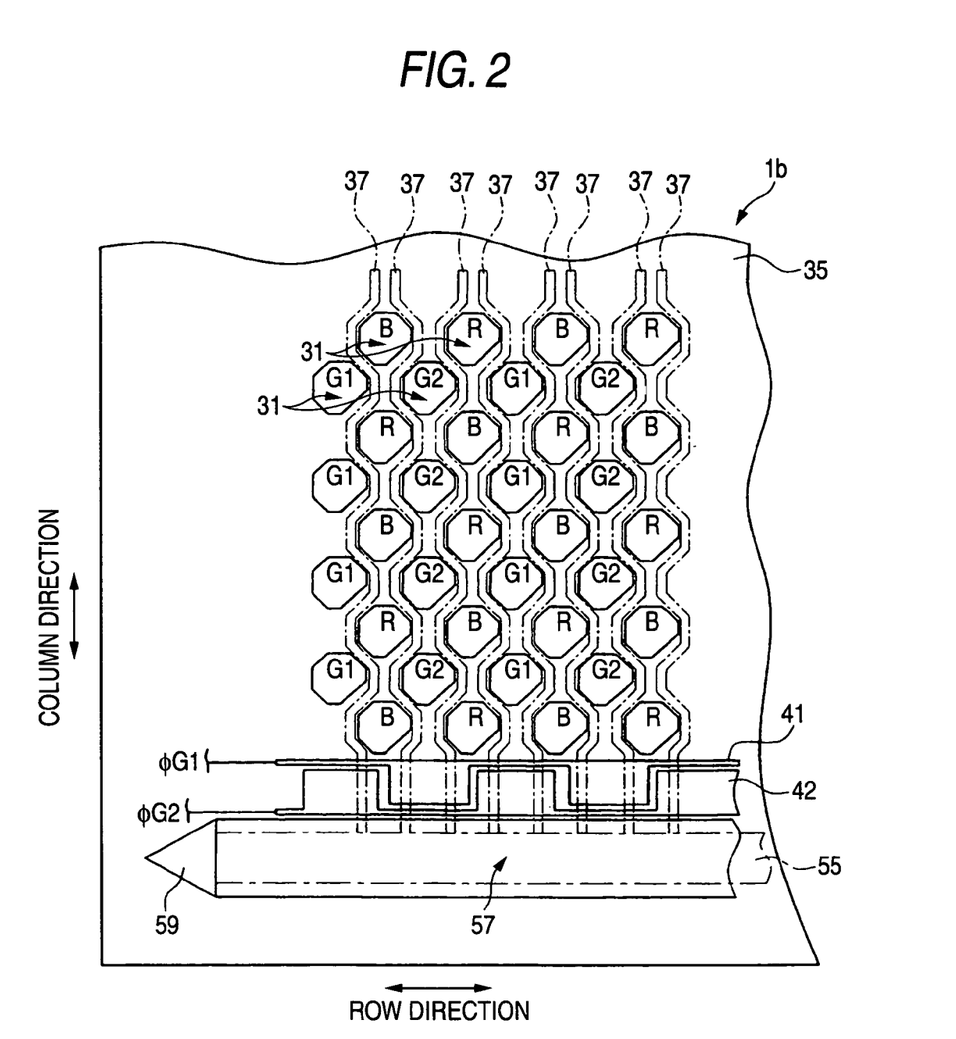
FIG. 2 is a partly plan view showing a schematic configuration of a solid-state image sensing device shown in FIG. 1.

FIG. 2 is a partly plan view showing a schematic configuration of the solid-state image sensing device 1b according to this embodiment.

As shown in FIG. 2, the solid-state image sensing device 1b includes a large number of photoelectric conversion devices 31, vertical transfer paths (VCCDs) 37, a horizontal transfer portion 57, an output amplifier 59, and gate electrodes 41 and 42. The photoelectric conversion devices 31 are arranged in rows and columns perpendicular to the rows on a semiconductor substrate 35. The VCCDs 37 are constituted by CCDs which serve as first transfer paths through which charges generated in the large number of photoelectric conversion devices 31 are transferred in the column direction. The horizontal transfer portion 57 includes a horizontal transfer path (HCCD) 55 constituted by a CCD which serves as a second transfer path through which the charges transferred from the VCCDs 37 are transferred in the row direction. The output amplifier 59 outputs a signal in accordance with the charges transferred from the HCCD 55. The gate electrodes 41 and 42 are formed, through an electrically insulating film, on the VCCDs 37 between the HCCD 55 and the last row of photoelectric conversion devices which are the photoelectric conversion devices arranged in the last row.

The large number of photoelectric conversion devices 31 include photoelectric conversion devices (hereinafter referred to as R photoelectric conversion devices) each for detecting R light and generating and storing corresponding R charge, photoelectric conversion devices (hereinafter referred to as G photoelectric conversion devices) each for detecting G light and generating and storing corresponding G charge, and photoelectric conversion devices (hereinafter referred to as B photoelectric conversion devices) each for detecting B light and generating and storing corresponding B charge. In FIG. 2, for the sake of convenience, the reference symbol R designates an R photoelectric conversion device 31, the reference symbols G1 and G2 designate G photoelectric conversion devices 31, and the reference symbol B designates a B photoelectric conversion device 31.

The large number of photoelectric conversion devices 31 are configured so that a large number of photoelectric conversion device rows each containing a plurality of photoelectric conversion devices 31 arranged in the row direction are arranged in the column direction. The large number of photoelectric conversion device rows include first photoelectric conversion device rows, and second photoelectric conversion device rows. In each first photoelectric conversion device row, R photoelectric conversion devices 31 and B photoelectric conversion devices 31 are arranged alternately. In each second photoelectric conversion device row, only G photoelectric conversion devices 31 are arranged.

As shown in FIG. 2, the first photoelectric conversion device rows and the second photoelectric conversion device rows are arranged alternately at intervals of an equal pitch in the column direction. The first photoelectric conversion device rows and the second photoelectric conversion device rows are arranged while shifted from each other by about a half of the arrangement pitch of the photoelectric conversion devices 31 arranged in the row direction. Such arrangement of the photoelectric conversion devices is called "honeycomb array". In addition, the positional sequence of the B photoelectric conversion devices 31 and the R photoelectric conversion devices 31 contained in one first photoelectric conversion device row is reverse to the positional sequence of the B photoelectric conversion devices 31 and the R photoelectric conversion devices 31 contained in a first photoelectric conversion device row adjacent thereto in the column direction.

Charge transfer electrodes not shown are formed on the VCCDs 37 through an electrically insulating film. Two charge transfer electrodes are provided for each photoelectric conversion device 31. Each of the two charge transfer electrodes is shaped like a zigzag line extending along the row direction in between rows of photoelectric conversion devices 31. The VCCDs 37 are four-phase driven by driving pulses provided from the drive portion 4 to the charge transfer electrodes. In the solid-state image sensing device 1b, a charge readout region is provided in a position corresponding to the lower right of each photoelectric conversion device 31 shown in FIG. 2, so that charge is read out from the charge readout region to a corresponding VCCD 37. The solid-state image sensing device 1b allows progressive drive for reading out charges from the first photoelectric conversion device row and the second photoelectric conversion device row simultaneously and transferring the charges and also allows interlace drive for reading out charges from the first photoelectric conversion device row and the second photoelectric conversion device row separately and transferring the charges. Incidentally, the VCCDs 37 under the charge transfer electrodes which are located so as to be adjacent to the gate electrode 41 are hereinafter referred to as "final-stage VCCDs 37".

Figure 3:
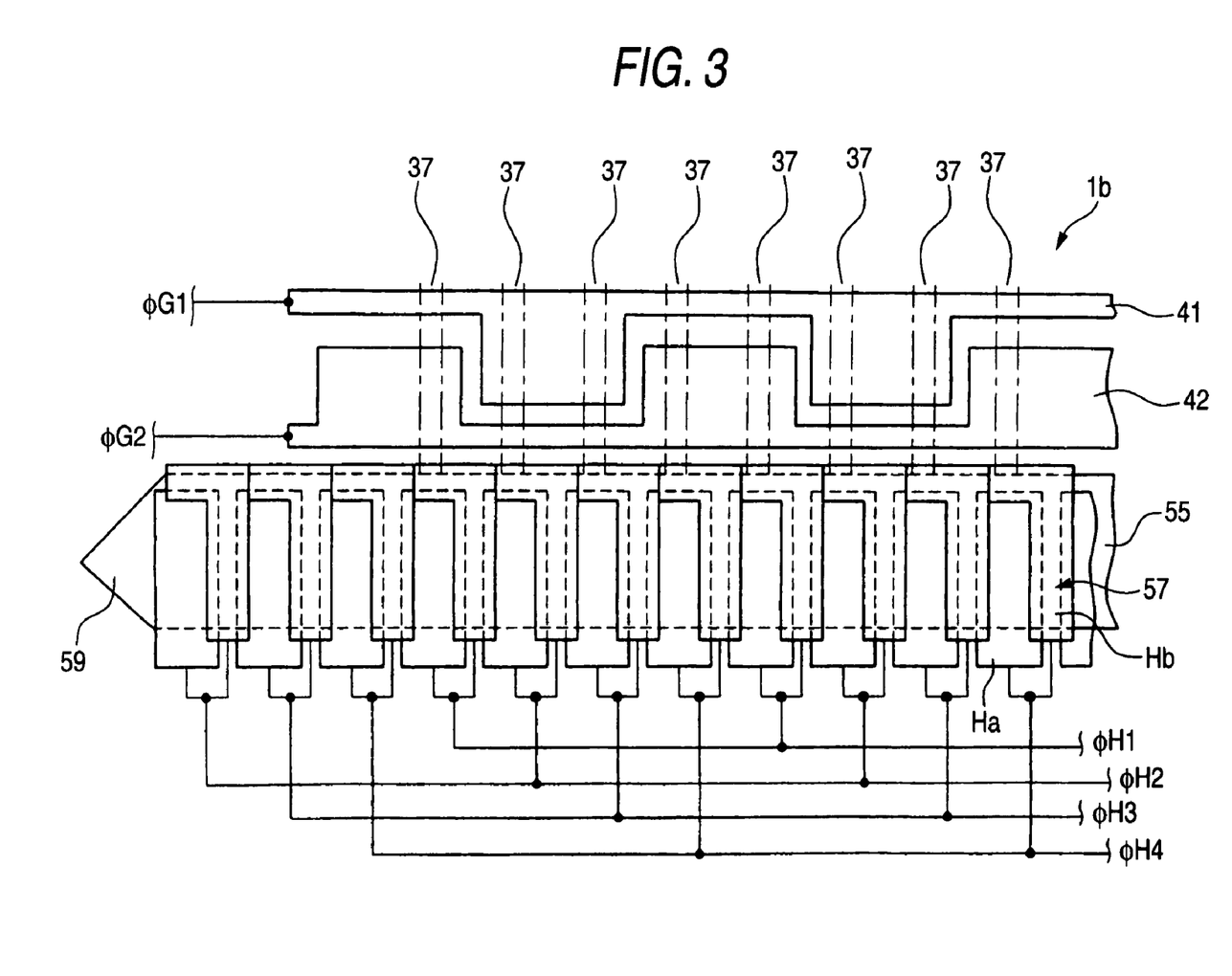
FIG. 3 is a partly enlarged plan view schematically showing a horizontal transfer portion 57 in the solid-state image sensing device shown in FIG. 2.

FIG. 3 is a partly enlarged plan view schematically showing the horizontal transfer portion 57 in the solid-state image sensing device shown in FIG. 2.

As shown in FIG. 3, the horizontal transfer portion 57 has an HCCD 55 extending like a belt in the row direction, and a large number of first and second horizontal transfer electrodes Ha and Hb formed on the HCCD 55. Each first horizontal transfer electrode Ha is shaped like a rectangle in plan view. Each second horizontal transfer electrode Hb is shaped like an inverted L figure in plan view. Horizontal transfer pulses $\phi$H1 to $\phi$H4 are supplied from the drive portion 4 to the first and second horizontal transfer electrodes Ha and Hb to thereby four-phase drive the HCCD 55.

The gate electrodes 41 and 42 are provided for controlling the transfer timing so that charges transferred to the final-stage VCCDs 37 can be transferred to the HCCD 55. A control pulse $\phi$G1 is supplied from the drive portion 4 to the gate electrode 41 whereas a control pulse $\phi$G2 is supplied from the drive portion 4 to the gate electrode 42. When the control pulses $\phi$G1 and $\phi$G2 are in low level, a potential barrier is formed so that the charges in the final-stage VCCDs 37 are not transferred to the HCCD 55. When the control pulses $\phi$G1 and $\phi$G2 are in high level, the potential barrier disappears so that the charges in the final-stage VCCDs 37 can be transferred to the HCCD 55. In this embodiment, the gate electrodes 41 and 42 are formed so that R charges and B charges read out from the first photoelectric conversion device row and transferred to the final-stage VCCDs 37 can be transferred to the HCCD 55 in accordance with charges of the same color component.

Next, a method for driving the solid-state image sensing device 1b will be described based on the operating conditions of the final-stage VCCDs 37 and the HCCD 55 in the case where the solid-state image sensing device 1b is interlace-driven.

The driving method according to this embodiment is characterized in that an operation of transferring charges read out of the first photoelectric conversion device row from the VCCDs 37 to the HCCD 55 and an operation of transferring the charges transferred to the HCCD 55 in the row direction are performed with discrimination between the B charges and the R charges contained in the charges read out of the first photoelectric conversion device row.

Figure 4:
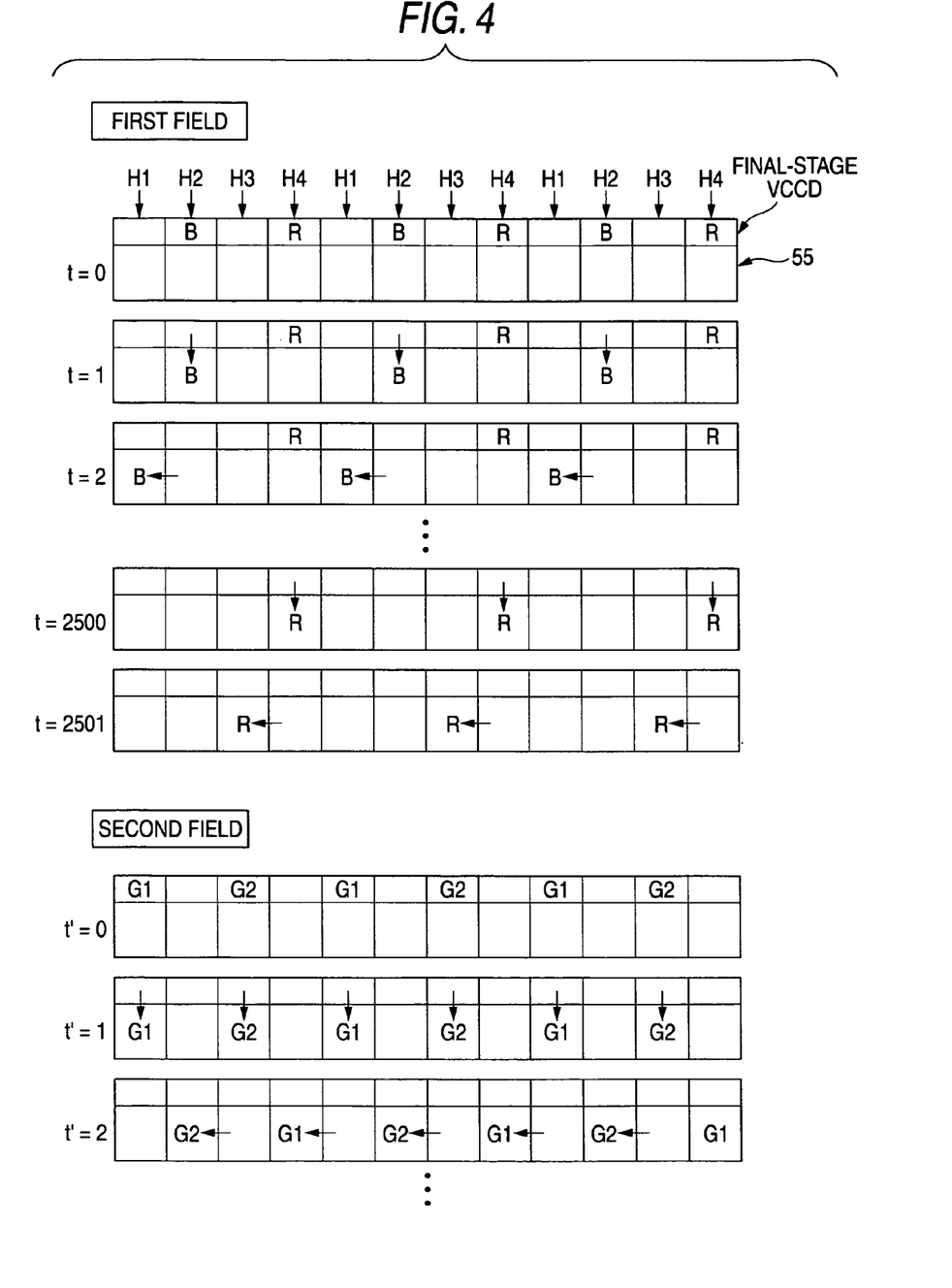
FIG. 4 is a view for explaining a method for driving the solid-state image sensing device according to the embodiment.

FIG. 4 is a view for explaining the method for driving the solid-state image sensing device 1b. Blocks of the HCCD 55 in columns designated by the reference symbols H1 to H4 in FIG. 4 show portions of the HCCD 55 which are located under the horizontal transfer electrodes Ha and Hb and to which the horizontal transfer pulses $\phi$H1 to $\phi$H4 are applied respectively. As shown in FIG. 4, in the solid-state image sensing device 1b, a block of the HCCD 55 is formed for each of the large number of VCCDs 37.

First, in a first field, charges are read out from the photoelectric conversion devices contained in a first photoelectric conversion device row to the VCCDs 37 and vertical transfer pulses are supplied to the charge transfer electrodes so that the charges read out from the first photoelectric conversion device row are transferred to the final-stage VCCDs 37 (FIG. 4: time t=0). Incidentally, the horizontal transfer pulses $\phi$H1 to $\phi$H4 and the control pulses $\phi$G1 and $\phi$G2 are in low level respectively during the transfer operation of the VCCDs 37.

Then, the control pulse $\phi$G1 is set at high level and the horizontal transfer pulse $\phi$H2 is set at high level, so that only B charges in the final-stage VCCDs 37 are transferred to the HCCD 55 (FIG. 4: time t=1). Then, the control pulse $\phi$G1 is returned to low level, the horizontal transfer pulse $\phi$H2 is set at low level and the horizontal transfer pulse $\phi$H1 is set at high level, so that the B charges are transferred horizontally from the right to the left in FIG. 2 (FIG. 4: time t=2). Then, an operation of setting the potential of portions of the HCCD 55 holding the B charges at low level and setting the potential of left adjacent portions of the HCCD 55 at high level is repeated likewise so that the B charges read out from one first photoelectric conversion device row are transferred successively from the right to the left.

When horizontal transfer of the B charges is completed, the control pulse $\phi$G2 is set at high level and the horizontal transfer pulse $\phi$H4 is set at high level so that only R charges in the final-stage VCCDs 37 are transferred to the HCCD 55 (FIG. 4: time t=2500). Then, the control pulse $\phi$G2 is returned to low level, the horizontal transfer pulse $\phi$H4 is set at low level and the horizontal transfer pulse $\phi$H3 is set at high level, so that the R charges are transferred horizontally from the right to the left in FIG. 2 (FIG. 4: time t=2501). Then, an operation of setting the potential of portions of the HCCD 55 holding the R charges at low level and setting the potential of left adjacent portions of the HCCD 55 at high level is repeated likewise so that the R charges read out from one first photoelectric conversion device row are transferred successively from the right to the left.

After the B charges and the R charges read out from one first photoelectric conversion device row are transferred to the HCCD 55 respectively independently and then transferred horizontally, vertical transfer pulses are supplied to the charge transfer electrodes so that charges read out from a next first photoelectric conversion device row are transferred to the final-stage VCCDs 37 and the aforementioned drive is retried. By repeating the aforementioned drive, a signal corresponding to the charges read out from all the first photoelectric conversion device rows are output from the output amplifier 59.

Next, in a second field, charges are read out from the photoelectric conversion devices 31 contained in one second photoelectric conversion device row to the VCCDs 37 and vertical transfer pulses are supplied to the charge transfer electrodes, so that the charges read out from the second photoelectric conversion device row are transferred to the final-stage VCCDs 37 (FIG. 4: time t'=0). Incidentally, the horizontal transfer pulses $\phi$H1 to $\phi$H4 and the control pulses $\phi$G1 and $\phi$G2 are in low level respectively during the transfer operation of the VCCDs 37.

Then, the control pulses $\phi$G1 and $\phi$G2 are set at high level and the horizontal transfer pulses $\phi$H1 and $\phi$H3 are set at high level, so that G charges in the final-stage VCCDs 37 are transferred to the HCCD 55 (FIG. 4: time t'=1). Then, the control pulses φG1 and φG2 are returned to low level, the horizontal transfer pulses φH1 and φH3 are set at low level and the horizontal transfer pulses φH2 and φH4 are set at high level, so that the G charges are transferred horizontally from the right to the left in FIG. 2 (FIG. 4: time t'=2). Then, an operation of setting the potential of portions of the HCCD 55 holding the G charges at low level and setting the potential of left adjacent portions of the HCCD 55 at high level is repeated likewise so that the G charges read out from one second photoelectric conversion device row are transferred successively from the right to the left.

After the G charges read out from one second photoelectric conversion device row are transferred to the HCCD 55 and then transferred horizontally, vertical transfer pulses are supplied to the charge transfer electrodes so that charges read out from a next second photoelectric conversion device row are transferred to the final-stage VCCDs 37 and the aforementioned drive is retried. By repeating the aforementioned drive, a signal corresponding to charges read out from all the second photoelectric conversion device rows is output from the output amplifier 59.

According to the aforementioned driving method, the R charges and the B charges in the HCCD 55 are separately transferred horizontally. Thus, charges of different color components are not mixed during horizontal transfer so that color mixing can be avoided. As a result, it is not necessary to provide a limitation on the driving frequency of the HCCD 55 as in the example according to the background art. Thus, even in the case where the number of photoelectric conversion devices is increased greatly, the driving frequency can be made high in accordance with the increase in the number of photoelectric conversion devices.

Although the embodiment has been described on the case where interlace drive is taken as an example, it is possible to avoid color mixing even in the case where progressive drive is used. In this case, charges read out from the first photoelectric conversion device rows and charges read out from the second photoelectric conversion device rows are transferred alternately to the final-stage VCCDs 37. Accordingly, the drive in the first field and the drive in the second field as shown in FIG. 4 may be changed over from one to another in one field.

Although the embodiment has been described on the case where a honeycomb array is used as an example of arrangement of the large number of photoelectric conversion devices 31, the driving method according to this embodiment can be used as long as photoelectric conversion device rows in each of which photoelectric conversion devices for generating charges of one color component are arranged in the row direction and photoelectric conversion device rows in each of which various kinds of photoelectric conversion devices for generating charges of different color components are mixedly arranged in the row direction are arranged in the column direction. That is, the driving method according to this embodiment can be also applied to a solid-state image sensing device arranged in the form of a tetragonal lattice in which first photoelectric conversion device rows and second photoelectric conversion device rows are not shifted from each other in the row direction.

The drive to avoid color mixing in this embodiment is preferably performed only in the case where the solid-state image sensing apparatus 100 is set in a still image sensing mode for sensing and recording a still image. Since high quality is not required in the case of a moving image sensing mode for sensing and recording a moving image, power consumption can be saved when the aforementioned drive is performed only in the still image sensing mode. In this case, in the moving image sensing mode, drive for sensing a moving image may be performed in the condition that the control pulses φG1 and φG2 are always at high level.

Although the embodiment has been described on the case where the timing of transferring charges from the final-stage VCCDs 37 to the HCCD 55 is controlled by use of the gate electrodes 41 and 42, the invention is not limited to this method. For example, this control may be performed by use of a line memory. In this case, charges corresponding to one photoelectric conversion device row are stored in the line memory in advance. As for a row in which B charges and R charges are mixed, the R charges and the B charges may be transferred independently in such a manner that after the B charges are transferred from the line memory to the HCCD 55 and then transferred horizontally, the R charges are transferred from the line memory to the HCCD 55 and then transferred horizontally.

Although the embodiment has been described on the case where a solid-state image sensing device for detecting light with the primary colors of R, G and B is taken as an example, the invention is not limited thereto. The same operation and effect can be also obtained when the invention is applied to a solid-state image sensing device or the like for detecting light with complementary colors.

According to the invention, it is possible to provide a solid-state image sensing device driving method and a solid-state image sensing apparatus in which color mixing can be avoid while the driving frequency of an HCCD can be set at a value enough to satisfy increase in the number of photoelectric conversion devices.

The entire disclosure of each and every foreign patent application from which the benefit of foreign priority has been claimed in the present application is incorporated herein by reference, as if fully set forth.

What is claimed is:
1. A solid-state image sensing apparatus comprising:
a solid-state image sensing device comprising:
a plurality of photoelectric conversion devices arranged in rows and columns perpendicular to the rows, said plurality of photoelectric conversion devices comprising a plurality of kinds of photoelectric conversion devices for generating charges of different color components respectively, so as to comprise a plurality of photoelectric conversion device rows each including those of the photoelectric conversion devices arranged in each of the rows, wherein the photoelectric conversion device rows comprise (i) first photoelectric conversion device rows each in which different kinds of photoelectric conversion devices are mixed, and (ii) second photoelectric conversion device rows each of which has one kind of the photoelectric conversion devices;
first transfer paths through which charges generated by the photoelectric conversion devices are transferred in a column direction; and
a second transfer path through which the charges transferred through the first transfer paths are transferred in a row direction; and
a drive portion that outputs a drive signal for performing drive by:
a first step of transferring charges read out of each of the first photoelectric conversion device rows from the corresponding ones of the first transfer paths to the second transfer path and then transferring the charges from the second transfer path in the row direction; and
a second step of transferring charges read out of each of the second photoelectric conversion device rows from the corresponding ones of the first transfer paths to the sec- ond transfer path and then transferring the charges from the second transfer path in the row direction, wherein, in the first step, a set of: an operation of transferring the charges read out of the first photoelectric conversion device row from the corresponding ones of the first transfer paths to the second transfer path; and an operation of transferring the charges transferred to the second transfer path in the row direction is separately performed with respect to respective sets of charges of the same color component contained in the charges read out of the first photoelectric conversion device rows.

2. A solid-state image sensing apparatus according to claim 1, wherein drive for performing said set of the transfer operations separately with respect to respective sets of charges of the same color component is performed when a still image is sensed and recorded by the solid-state image sensing device.

3. A solid-state image sensing apparatus according to claim 1, wherein reading charges out of photoelectric conversion devices is performed twice in such a manner that reading charges out of the first photoelectric conversion device rows and reading the charges out of the second photoelectric conversion device rows are performed separately.

4. A solid-state image sensing apparatus according to claim 1, wherein those of the photoelectric conversion devices contained in each of the first photoelectric conversion device rows comprise photoelectric conversion devices for generating charges of a red component and photoelectric conversion devices for generating charges of a blue component; and those of the photoelectric conversion devices contained in each of the second photoelectric conversion device rows comprise photoelectric conversion devices for generating charges of a green component.

5. A solid-state image sensing apparatus according to claim 1, wherein the first photoelectric conversion device rows and the second photoelectric conversion device rows are arranged alternately in the column direction while shifted from each other in the row direction by about a half of an arrangement pitch of the photoelectric conversion devices arranged in the row direction.

6. A solid-state image sensing apparatus according to claim 1, further comprising:

two kinds of gate electrodes to transfer the charges read out of each of the first photoelectric conversion device rows to the second transfer path separately with respect to respective sets of charges of the same color component contained in the charges read out of the first photoelectric conversion device rows.

* * * * *